United States Patent
Dalla Piazza et al.

(10) Patent No.: US 7,138,752 B1
(45) Date of Patent: *Nov. 21, 2006

(54) SMALL-SIZED PIEZOELECTRIC RESONATOR

(75) Inventors: Silvio Dalla Piazza, St-Imier (CH); Bruno Studer, Riedholz (CH); Thomas Luethi, Grenchen (CH)

(73) Assignee: ETA SA Manufacture Horlogere Suisse, Grenchen (CH)

( * ) Notice: Subject to any disclaimer, the term of this patent is extended or adjusted under 35 U.S.C. 154(b) by 11 days.

This patent is subject to a terminal disclaimer.

(21) Appl. No.: 11/148,437

(22) Filed: Jun. 9, 2005

(51) Int. Cl.
*H01L 41/08* (2006.01)

(52) U.S. Cl. .................................. 310/370
(58) Field of Classification Search ............... 310/370
See application file for complete search history.

(56) References Cited

U.S. PATENT DOCUMENTS

| | | | |
|---|---|---|---|
| 4,920,296 A * | 4/1990 | Takahashi et al. ......... | 310/348 |
| 6,194,817 B1 * | 2/2001 | Yachi et al. ............... | 310/370 |
| 6,700,313 B1 * | 3/2004 | Dalla Piazza et al. ..... | 310/370 |
| 2002/0096974 A1 | 7/2002 | Moon et al. | |
| 2003/0052743 A1 | 3/2003 | Dalla Piazza et al. | |
| 2005/0040737 A1 * | 2/2005 | Tanaya ..................... | 310/370 |
| 2005/0062368 A1 * | 3/2005 | Hirasawa et al. ......... | 310/370 |

OTHER PUBLICATIONS

Patent Abstracts of Japan, vol. 008, No. 004 Jan. 10, 1984 & JP 58 170110 (Citizen Tokei KK), Oct. 6, 1983.
Patent Abstracts of Japan, vol. 015, No. 24, Jan. 21, 1991 & JP 02 268220, Nov. 1, 1990.

* cited by examiner

*Primary Examiner*—Mark Budd
(74) *Attorney, Agent, or Firm*—Sughrue Mion, PLLC

(57) ABSTRACT

The piezoelectric resonator according to the invention includes a tuning fork shaped part with two parallel vibrating arms, connected to each other by a linking part, from which protrude a central arm located between both vibrating arms of the tuning fork shaped part, the vibrating arms carrying first electrodes to make them vibrate, these electrodes being connected to connection elements carried by the central arm, wherein a slot has been cut within the linking part opposite to the central arm and wherein second electrodes have been arranged along said slot.

10 Claims, 2 Drawing Sheets

SMALL-SIZED PIEZOELECTRIC RESONATOR

FIELD OF INVENTION

The present invention concerns piezoelectric resonators and more particularly resonators of small dimensions which are most often used for making frequency generators in particular for portable electronic equipment, in numerous fields such as horology, information technology, telecommunications and the medical field.

BACKGROUND OF THE INVENTION

Such a resonator of small dimensions has been disclosed in the prior art document U.S. Pat. No. 6,700,313 filed in the name of the name Assignee, which is enclosed herewith by way of reference. Resonator 10 represented on FIG. 4, which is intended to be mounted in a case, includes a tuning fork shaped part with two parallel arms 12, 14 connected to each other by a linking part 16 and carrying electrodes 20, 22 to make them vibrate, these electrodes being connected to connecting pads 28, 30 intended to be electrically connected to the exterior of the case. Resonator 10 also includes a central arm 18 attached to linking part 16 and located between arms 12, 14 of the tuning fork shaped part, substantially equidistant from them, this central arm 18 having a greater mass than that of the arms of the tuning fork shaped part and connected pads 28, 30 are carried by this central arm. This resonator is mounted in a case of parallelepiped shape by fixing its central arm 18 to at least one support secured to the bottom of the case.

The above described kind of resonators, called hereinafter three arm resonators, allows breaking away from many problems encountered with conventional tuning fork resonators.

One of these problems is that the dimensional and functional features of the conventional tuning fork resonators are optimised for mounting them in metallic cases and not in ceramic cases. For example, the ratio between their length and their width is ill suited to the manufacture of such cases, in particular when the cases are of the SMD (Surface Mounting Device) type, i.e. meant to be automatically mounted on hole-free printed circuit boards. Because of this, a conventional tuning fork resonator and its connection to the case do not have very good resistance to shocks.

Further conventional tuning fork resonators are liable to tip towards the bottom of the case when it is fixed onto a step of the case.

Furthermore, since the thermal expansion coefficients of ceramic material and quartz are different enough to create mechanical stresses in the resonator which can not only be felt in the arms of the tuning fork and disturb the working of the resonator when the temperature changes but can also break the solder or detach connection pads of the resonator from those of the case and alter or even cut the electric connection between the resonator electrodes and the external contact pads of the case.

For the same reason, if there is an incipient fracture on the side of base of the tuning fork where connection pads are situated, a significant temperature variation can even break the tuning fork.

Finally, when the resonator is vacuum packed, the vacuum is never perfect and the stirring of the atmosphere by the tuning fork arms when the resonator vibrates can modify the operating parameters of the resonator when its arms come close to each other, more so than in the case of a metallic case.

Thus, three arm resonators enable satisfactory solutions to be brought to the various problems posed by conventional tuning fork resonators. Nevertheless although these three arm resonators have proved to be advantageous, miniaturization requirements as well as energy consumption required to maintain vibrations of the tuning fork are always critical issues for mobile phone or wristwatch applications.

SUMMARY OF THE INVENTION

The main goal of the invention is to provide a three arm resonator which enables to reduce the size of the resonator, and more particularly its length. For that purpose according to a first aspect of the invention, it concerns a piezoelectric resonator including a tuning fork shaped part with two parallel vibrating arms, connected to each other by a linking part, from which protrude a central arm located between both vibrating arms of the tuning fork shaped part, the vibrating arms carrying first electrodes to make them vibrate, these electrodes being connected to connection elements carried by said central arm, wherein a slot has been cut within said linking part opposite to said central arm and wherein second electrodes have been arranged along said slot. Thus optimisation of the vibrating coupling effect of the vibrating arms is obtained by retrieving the electrical field in all high stressed areas of the cut linking part with the second electrodes. Furthermore for a determined frequency, use of these additional electrodes, preferably grooved, allows the overall length of the resonator to be reduced.

According to another aspect of the invention, in order to avoid electrode short circuit in the zone wherein second electrodes go around the slot, each of these second electrodes are designed with a relief zone facing the slot portion extending within the central arm.

According to another aspect of the invention, in order to reduce consumption of energy by producing an excitation electrical field which is more homogeneous and locally more intense and for which vibration loss at the arms is low even when the size of the vibrating piece is miniaturized and the CI value (crystal impedance or equivalent series resistance) can also be suppressed at a low level, at least one groove is formed on at least one of a front side and a rear side of each vibrating arm. Further, use of grooves on the vibrating arms furnishes precise performances even when the device is miniaturized.

According to another aspect of the invention and for the same reason as the previous above described aspect, grooves have been hollowed out under said second electrodes.

According to another aspect of the invention, in order to guarantee an accurate and solid positioning of the resonator inside its packaging, fixing and positioning holes or recesses have been cut through the central arm.

According to another aspect of the invention, in order to further reduce the dimensions of such a three arm resonator, in particular its length, the vibrating arms end in flippers, which width being larger than that of the vibrating arms.

BRIEF DESCRIPTION OF THE DRAWINGS

Other features and advantages of the invention will appear upon reading the following description which refers to the annexed drawings in which.

DETAILED DESCRIPTION OF THE INVENTION

Figure 1:
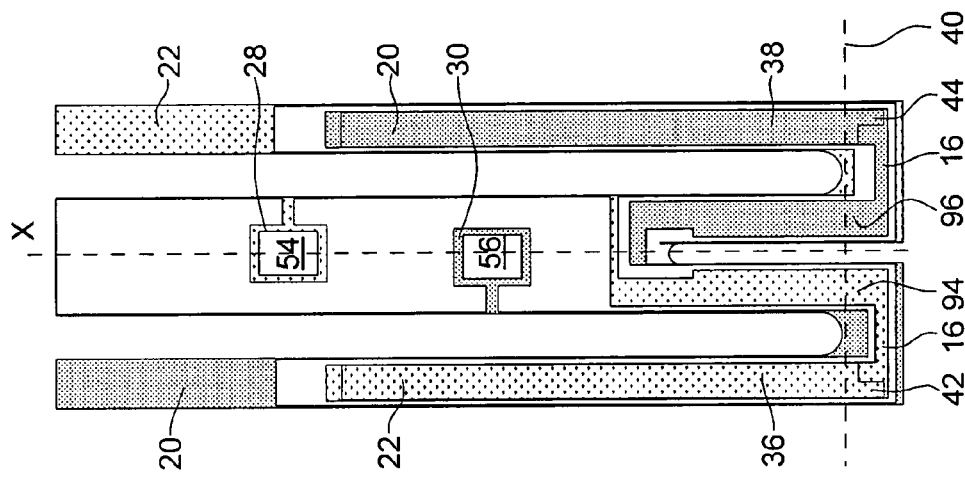
FIG. 1 is a bottom view of a first embodiment of a piezoelectric resonator according to the invention.

In the first embodiment shown in relation with FIG. 1, the resonator according to the invention, designated by the reference numeral 10, includes a tuning fork shaped part with two vibrating arms 12 and 14 joined by a linking part 16 to which a central arm 18, located between arms 12 and 14 and parallel thereto, is attached, the whole assembly being made in a single piece and of quartz.

As shown by FIG. 1, vibrating arms 12 and 14 carry two groups of electrodes 20 and 22, which are connected to each other by conductive paths respectively 24 and 26, carried by linking part 16 of the tuning fork shaped part. As they are shown in the drawing, these electrodes and conductive paths are disposed to make arms 12 and 14 vibrate in flexure mode, but they could have a different configuration to make the arms vibrate in the same mode or another mode (torsion, shear, etc.). Returning to central arm 18, FIG. 1a shows that it carries on its back face two conductive connection pads 28 and 30 located on either side of the centre of gravity G of the resonator lengthways and preferably equidistant from it, these pads 28 and 30 being connected by conductive paths 32 and 34 respectively to conductive paths 26 and 24 which connect the electrodes of each group 20 and 22 to each other. These pads 28 and 30 may also be used for fixing the resonator inside its packaging (not shown).

As visible in FIG. 1, the width of central arm 18 shall be at least slightly more than one and a half that of an arm 12 or 14 of tuning fork shaped part. Likewise, the length of central arm 18 is not necessarily equal to that of arms 12 and 14, as shown by FIGS. 1a and 1b. It could be for example shorter. However, it is important, on the one hand, that central arm 18 is substantially equidistant from arms 12 and 14, this distance being able to be equal to that which separates the arms of a conventional tuning fork resonator, and that, on the other hand, this central arm 18 has a much greater mass than that of arms 12 and 14 which have to vibrate.

A slot 80 is provided within linking part 16 on the opposite side to the one on which central arm 18 is protruding from and preferably along the longitudinal axis X of the resonator. This slot 80 has for effect to virtually lengthen vibrating arms 12, 14 to the corresponding half of linking part 16. For further optimizing the vibrating coupling effect of the vibrating arms by retrieving the electrical field in all high stressed areas of the cut linking part, additional electrodes 82, 84 are arranged along slot 80. Thus, for a determined frequency, use of these electrodes 82, 84 allows the overall length of the resonator to be reduced. Advantageously in order to maximize the length of vibrating arms 12 and 14, a portion of slot 80 extends along the longitudinal axis X of the resonator within central arm 18, said portion being the one located above dotted line 40 delimiting linking part 16 from central arm 18. Furthermore, advantageously each of electrodes 82 and 84 have been designed with a relief zone 86, respectively 88, facing slot portion extending within the central arm in order to prevent electrode short circuit between connecting elements 90, respectively 92 and electrodes 82, respectively 84. Relief zones 86 and 88 let sufficient free space for safely arranging connecting elements 90 and 92.

Figure 2:
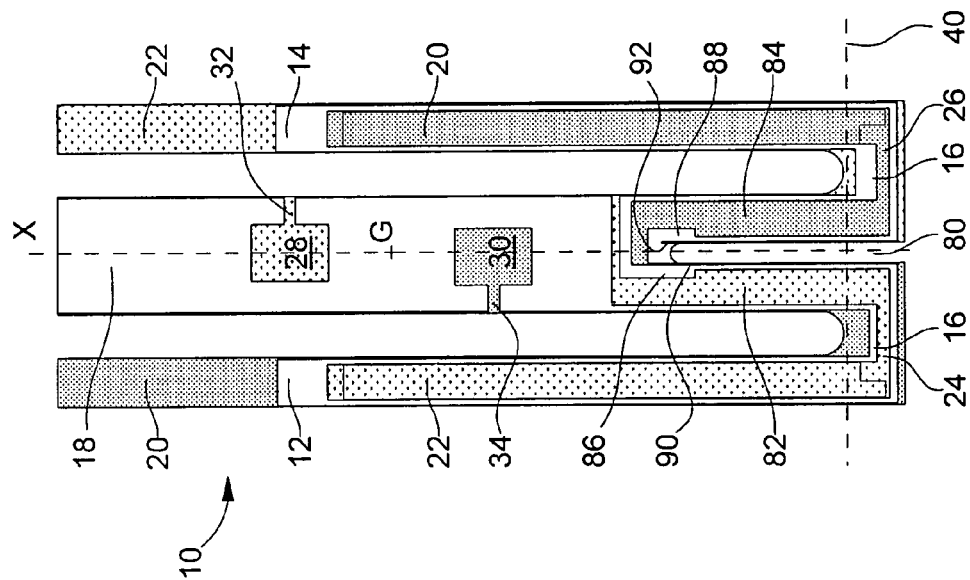
FIG. 2 is a bottom view of a second embodiment of a piezoelectric resonator according to the invention.
Figure 4:
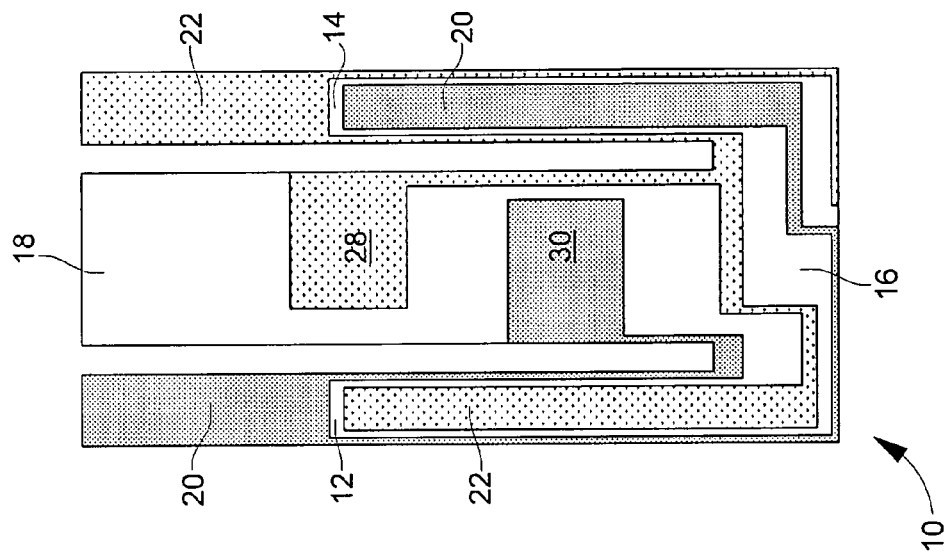
FIG. 4, already described, is a top view of a piezoelectric resonator according to the prior art.

FIG. 2 shows a second embodiment which differs from the first one in that in order to reduce consumption of energy by producing an excitation electrical field which is more homogeneous and locally more intense and for which vibration loss at the arms is low even when the size of the vibrating piece is miniaturized, at least one groove 36, 38 is formed on at least one of a front side and a rear side of each vibrating arm, respectively 12, 14. It will be appreciated that the depth of these grooves is preferably between 30% and 50% of the thickness of the corresponding vibrating arm in the depth direction and advantageously between 40% and 50%. It is to be noted that this ratio may be applicable to all forthcoming embodiments with grooves. Use of such grooves on the vibrating arms furnishes precise performances even when the device is miniaturized. As alternatives only one groove may be provided either on the front or the rear side of each vibrating arm, or two grooves may be provided on both the front and the rear sides.

Advantageously, in order to further increase the vibrating coupling effect of the vibrating arms, grooves 36, 38 extend in linking part 16. Portions 42, 44 of grooves 36, 38 extending in linking part 16, virtually delimited by dotted line 40, where mechanical stresses are maximums, allow retrieving the electrical field in this high stressed area. Preferably, these groove portions 42, 44 within linking part 16 are designed with non symmetric shapes with respect to the longitudinal axis of vibrating arms 12, 14, in order to render high stressed areas located in the linking part more robust to mechanical constraints Advantageously for the same reason, grooves 94, respectively 96 have been hollowed out under electrodes 82, respectively 84 to produce an excitation electrical field which is more homogeneous and locally more intense.

Advantageously, fixing and positioning means are arranged on central arm 18 to guarantee an accurate positioning and a robust fixing of resonator 10 inside its packaging. For that purpose, fixing and positioning holes 54 and 56 have been cut through central arm 18, these holes being preferably used also to connect the group of electrodes 20 and 22 of resonator 10 to conductive elements inside the packaging (not shown). Since these holes 54 and 56 have been cut through central arm 18, one may accurately positioned resonator 10 inside the packaging (not shown) by looking to marks designed on the bottom of said packaging. Furthermore, during the assembly of the resonator inside its packaging, holes 54, 56 are filled in with conductive glue that allows on the one hand electrically connecting electrodes 20, 22 to conductive elements inside the packaging (not shown) and on the other hand solidly fixing resonator 10 inside its packaging. Alternatively, fixing and positioning recesses may be provided instead of holes 54 and 56. As another alternative, one may provide with blind holes located on the back face of the central arm, i.e. the one supporting conductive elements 28 and 30. Positioning of the resonator can then be made by guiding these blind holes along corresponding bumps in the case.

Figure 3:
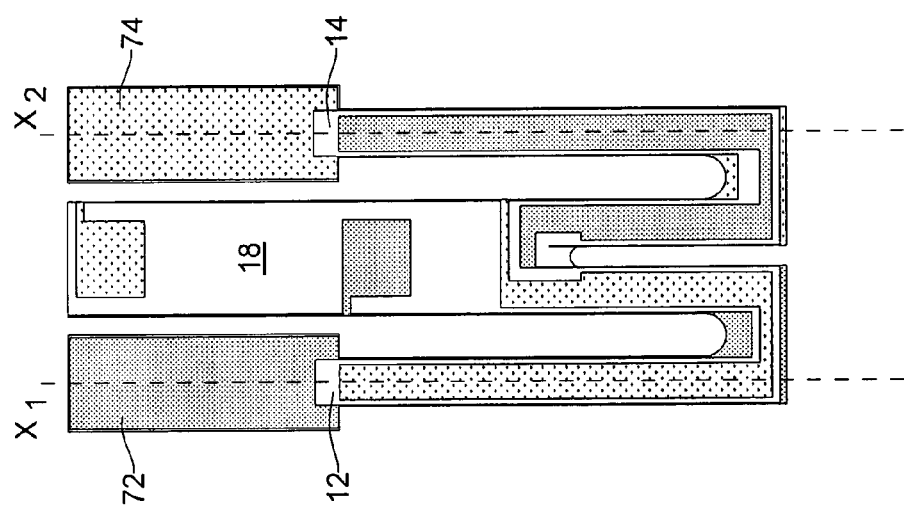
FIG. 3 is a bottom view of a third embodiment of a piezoelectric resonator according to the invention.

In the third embodiment shown in relation with FIG. 3, the resonator differs from the first one in that each vibrating arm 12, respectively 14, ends in a flipper 72, respectively 74. Preferably, these flippers 72 and 74 have a symmetrical rectangular shape with respect to the longitudinal axis ($X_1$, $X_2$) of corresponding vibrating arm 12, 14, the flipper width being approximately twice as that of vibrating arm. But in counterpart, it will appreciated that the flipper length can be deduced from the overall length of the vibrating arm without modifying the resonator properties, and that the length of central arm 18 is reduced accordingly in order not to extend beyond vibrating arms 12 and 14. Therefore the resonator length may be reduced accordingly.

It will be appreciated that preferably for further improving the shock resistance of the resonators according to any of the above presented embodiments, the cut out portions where vibrating arms 12, 14 or slot 80 are linked to linking part 16 are advantageously chosen to minimize visualisation of the crystalline planes of the resonator. In the example of a quartz resonator, the cut out portions form angles of approximately 60° or 120°.

Having described the invention with regard to certain specific embodiments, it is to be understood that these embodiments are not meant as limitations of the invention. Indeed, various modifications, adaptations and/or combination between embodiments may become apparent to those skilled in the art without departing from the scope of the annexed claims.

What is claimed is:

1. A piezoelectric resonator including a tuning fork shaped with two parallel vibrating arms connected to each other by a linking part, from which protrude a central arm located between both vibrating arms, said vibrating arms carrying first electrodes to make them vibrate, these electrodes being connected to connection elements carried by said central arm, wherein a slot has been cut within said linking part opposite to said central arm and wherein second electrodes have been arranged along said slot.

2. The resonator according to claim 1, wherein a portion of said slot extends along the longitudinal axis of the resonator within said central arm.

3. The resonator according to claim 2, wherein each of said second electrodes are designed with a relief zone facing said slot portion extending within said central arm.

4. The resonator according to claim 1, wherein at least one groove is formed on at least one of a front side and a rear side of each vibrating arm.

5. The resonator according to claim 4, wherein grooves have been hollowed out under said second electrodes.

6. The resonator according to claim 1, wherein fixing and positioning holes have been cut through said central arm.

7. The resonator according to claim 1, wherein fixing and blind holes have been cut in said central arm.

8. The resonator according to claim 1, wherein fixing and positioning recesses have been arranged on both sides of said central arm facing said vibrating arms.

9. The resonator according to claim 1, wherein said vibrating arms end in flippers, which width being larger than that of said vibrating arms.

10. The resonator according to claim 4, wherein depth of said groove is between 30% and 50%, and preferably between 40% and 50%, of the thickness of said vibrating arms in the depth direction.

* * * * *